(12) United States Patent
Tseng et al.

(10) Patent No.: US 9,397,217 B2
(45) Date of Patent: Jul. 19, 2016

(54) CONTACT STRUCTURE OF NON-PLANAR SEMICONDUCTOR DEVICE

(71) Applicant: Taiwan Semiconductor Manufacturing Company, Ltd., Hsin-Chu (TW)

(72) Inventors: Hsiang-Jen Tseng, Hsin-Chu (TW);
Ting-Wei Chang, New Taipei (TW);
Wei-Yu Chen, Hsin-Chu (TW);
Kuo-Nan Yang, Hsin-Chu (TW);
Ming-Hsiang Song, Shin-Chu (TW);
Ta-Pen Guo, Cupertino, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 70 days.

(21) Appl. No.: 13/730,052

(22) Filed: Dec. 28, 2012

(65) Prior Publication Data
US 2014/0183632 A1 Jul. 3, 2014

(51) Int. Cl.
*H01L 29/78* (2006.01)
*H01L 29/66* (2006.01)

(52) U.S. Cl.
CPC .......... *H01L 29/785* (2013.01); *H01L 29/7848* (2013.01)

(58) Field of Classification Search
CPC ............... H01L 21/823821; H01L 21/823431;
H01L 21/845; H01L 27/0886; H01L 27/0924;
H01L 27/1211; H01L 29/41791; H01L
29/66795; H01L 29/785; H01L 21/02063;
H01L 23/528; H01L 21/76805; H01L
21/76897; H01L 21/823475; H01L 21/823871;
H01L 23/485; H01L 29/66659; H01L
29/7835; H01L 29/7851; H01L 29/41; H01L
29/41775

See application file for complete search history.

(56) References Cited

U.S. PATENT DOCUMENTS

| 7,989,856 | B2 | 8/2011 | Goto et al. | |
|---|---|---|---|---|
| 2002/0074602 | A1* | 6/2002 | Lin et al. | 257/355 |
| 2004/0203211 | A1* | 10/2004 | Yang et al. | 438/299 |
| 2005/0148131 | A1* | 7/2005 | Brask | 438/199 |
| 2005/0164493 | A1* | 7/2005 | Liaw | 438/637 |
| 2006/0046449 | A1* | 3/2006 | Liaw | 438/585 |
| 2006/0071291 | A1* | 4/2006 | Yagishita | 257/471 |
| 2006/0073647 | A1* | 4/2006 | Inaba | 438/157 |
| 2006/0223335 | A1* | 10/2006 | Mathew | H01L 21/26506 438/766 |
| 2006/0244066 | A1* | 11/2006 | Yeo et al. | 257/347 |
| 2006/0261411 | A1* | 11/2006 | Hareland et al. | 257/353 |

(Continued)

FOREIGN PATENT DOCUMENTS

KR 20110098594 9/2011
TW 200425299 11/2004

*Primary Examiner* — Khiem D Nguyen
*Assistant Examiner* — Pauline Vu
(74) *Attorney, Agent, or Firm* — Slater Matsil, LLP

(57) ABSTRACT

The invention relates to a contact structure of a semiconductor device. An exemplary structure for a semiconductor device comprises an insulation region over a substrate; a gate electrode layer over the insulation region comprising a gate middle line; a first contact structure over the insulation region adjacent to the gate electrode layer comprising a first middle line, wherein the first middle line and the gate middle line has a first distance; and a second contact structure over the insulation region on a side of the gate electrode layer opposite to the first contact structure comprising a second middle line, wherein the second middle line and the gate middle line has a second distance greater than the first distance.

19 Claims, 13 Drawing Sheets

(56) References Cited

U.S. PATENT DOCUMENTS

| | | | |
|---|---|---|---|
| 2007/0001219 A1* | 1/2007 | Radosavljevic et al. | 257/327 |
| 2007/0019479 A1* | 1/2007 | Kim et al. | 365/189.05 |
| 2007/0029576 A1* | 2/2007 | Nowak et al. | 257/209 |
| 2007/0108471 A1* | 5/2007 | Oishi | 257/192 |
| 2007/0132009 A1* | 6/2007 | Takeuchi | H01L 21/845 257/321 |
| 2007/0181942 A1* | 8/2007 | Knoblinger et al. | 257/336 |
| 2008/0067613 A1* | 3/2008 | Anderson et al. | 257/401 |
| 2008/0142849 A1* | 6/2008 | Alvarez | H01L 21/26513 257/213 |
| 2009/0001464 A1* | 1/2009 | Booth et al. | 257/347 |
| 2009/0184306 A1* | 7/2009 | Mathew | H01L 27/2436 257/3 |
| 2010/0038679 A1* | 2/2010 | Chan et al. | 257/190 |
| 2010/0155846 A1* | 6/2010 | Mukherjee | H01L 21/28512 257/365 |
| 2010/0187656 A1* | 7/2010 | Ke et al. | 257/586 |
| 2010/0200916 A1* | 8/2010 | Gossner | H01L 29/083 257/335 |
| 2010/0237436 A1* | 9/2010 | Inaba | 257/392 |
| 2010/0276761 A1* | 11/2010 | Tung et al. | 257/384 |
| 2011/0068407 A1* | 3/2011 | Yeh et al. | 257/369 |
| 2011/0133285 A1* | 6/2011 | Liaw | 257/368 |
| 2011/0210404 A1 | 9/2011 | Su et al. | |
| 2012/0001197 A1* | 1/2012 | Liaw et al. | 257/77 |
| 2012/0043609 A1* | 2/2012 | Hafez et al. | 257/337 |
| 2012/0168817 A1 | 7/2012 | Abou-Khalil et al. | |
| 2012/0193707 A1* | 8/2012 | Huang | H01L 29/7816 257/335 |
| 2012/0211807 A1 | 8/2012 | Yu et al. | |
| 2014/0008733 A1* | 1/2014 | Shrivastava | H01L 21/823807 257/401 |

* cited by examiner

US 9,397,217 B2

CONTACT STRUCTURE OF NON-PLANAR SEMICONDUCTOR DEVICE

TECHNICAL FIELD

This disclosure relates to integrated circuit fabrication, and more particularly to a semiconductor device with a contact structure.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. In addition, strained materials in source/drain (S/D) portions of the FinFET utilizing selectively grown silicon germanium may be used to enhance carrier mobility.

However, there are challenges to implementation of such features and processes in complementary metal-oxide-semiconductor (CMOS) fabrication. For example, parasitic capacitance between S/D contact structure and the gate significantly increases if the gate wraps the fin, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
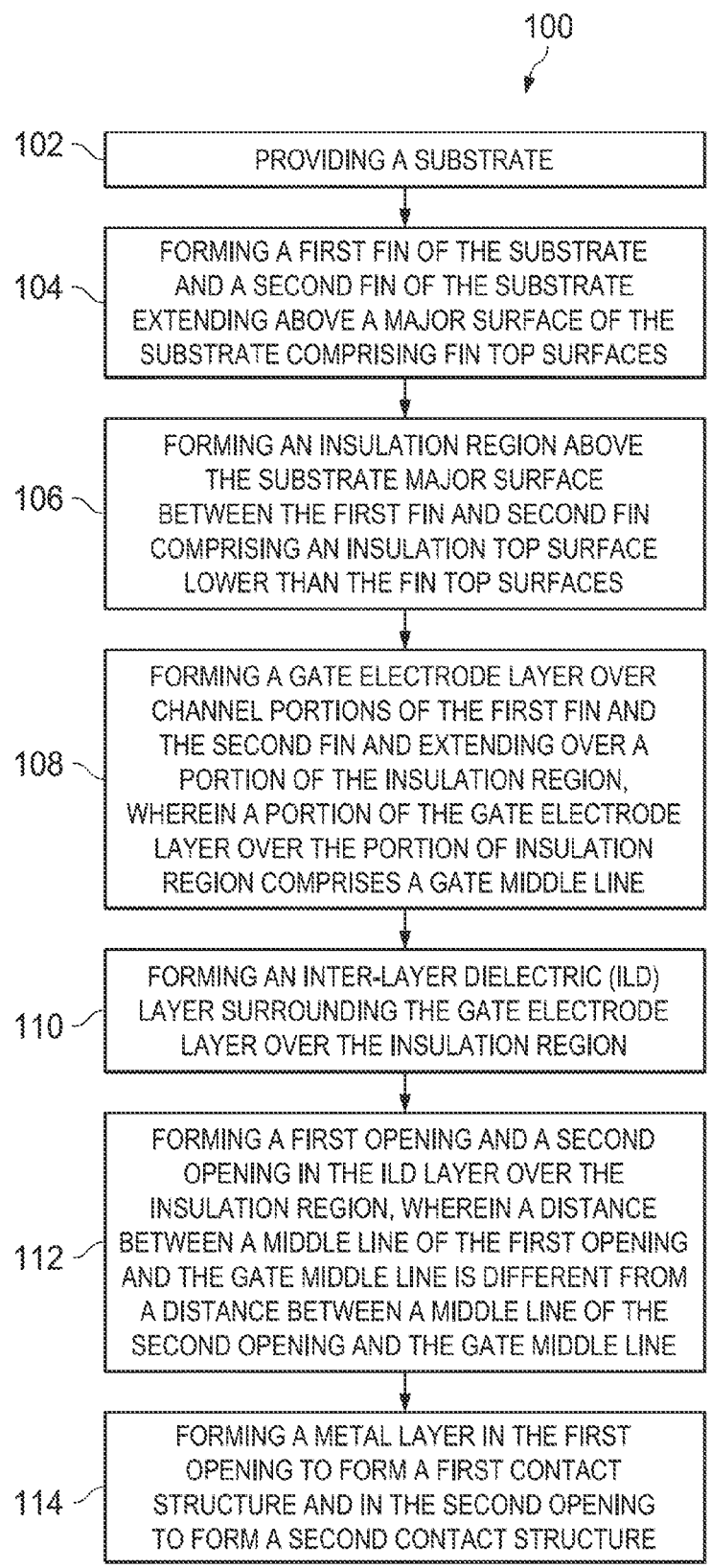
FIG. 1 is a flowchart illustrating a method of fabricating a contact structure of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a contact structure of a semiconductor device according to various aspects of the present disclosure. The method 100 begins with step 102 in which a substrate is provided. The method 100 continues with step 104 in which a first fin of the substrate and a second fin of the substrate are formed extending above a major surface of the substrate, wherein the first fin and second fin comprise fin top surfaces. The method 100 continues with step 106 in which an insulation region is formed above the substrate major surface between the first fin and second fin, wherein the insulation region comprises an insulation top surface lower than the fin top surfaces. The method 100 continues with step 108 in which a gate electrode layer is formed over channel portions of the first fin and the second fin and extending over a portion of the insulation region, wherein a portion of the gate electrode layer over the portion of insulation region comprises a gate middle line.

The method 100 continues with step 110 in which an interlayer dielectric (ILD) layer surrounding the gate electrode layer is formed over the insulation region. The method 100 continues with step 112 in which a first opening and a second opening are formed in the ILD layer over the insulation region, wherein a distance between a middle line of the first opening and the gate middle line are different from a distance between a middle line of the second opening and the gate middle line. The method 100 continues with step 114 in which a metal layer is formed in the first opening to form a first contact structure and in the second opening to form a second contact structure. The discussion that follows illustrates embodiments of semiconductor devices that can be fabricated according to the method 100 of FIG. 1.

Figure 2:
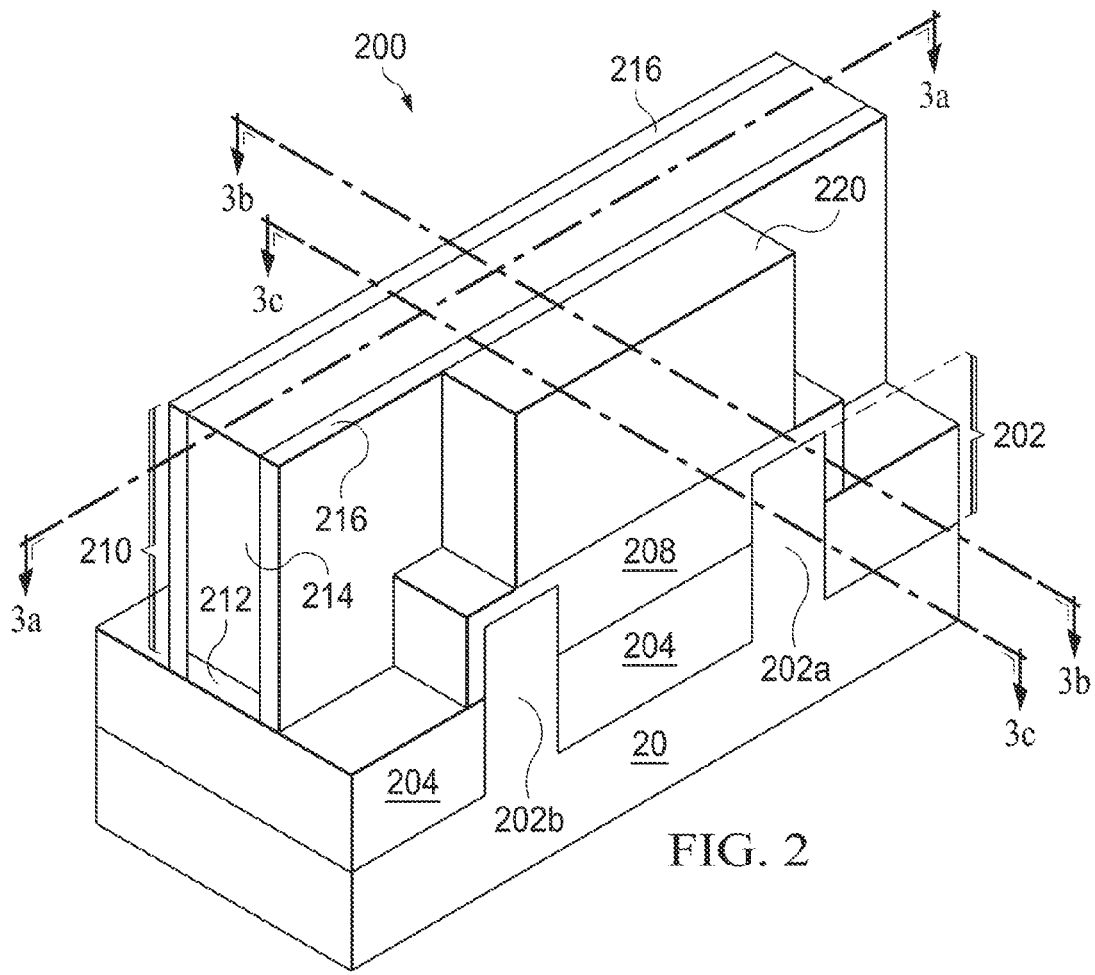
FIG. 2 is a perspective view of a semiconductor device comprising a contact structure according to various aspects of the present disclosure.

FIG. 2 is a perspective view of a semiconductor device 200 comprising a contact structure 220 according to various aspects of the present disclosure; and FIGS. 3A-10C are cross-section views of the semiconductor device 200 at various stages of fabrication according to various aspects of the present disclosure. Each figure denoted with a letter "A" shows an embodiment taken along line a-a (gate lengthwise) of FIG. 2; each figure denoted with a letter "B" shows an embodiment taken along line b-b (fin lengthwise) of FIG. 2; and each figure denoted with a letter "C" shows an embodiment taken along line c-c (between fins) of FIG. 2. As employed in the present disclosure, the term semiconductor device 200 refers to a fin field effect transistor (FinFET). The FinFET refers to any fin-based, multi-gate transistor. Other transistor structures and analogous structures are within the contemplated scope of the disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 10B are simplified for a better understanding of the concepts of the present disclosure. For example, although the figures illustrate the semiconductor device 200, it is understood the IC may comprise a number of other devices comprising resistors, capacitors, inductors, fuses, etc.

FIG. 2 illustrates a semiconductor device 200 fabricated using the steps in FIG. 1. The semiconductor device 200 comprises a FinFET (also referred to as a FinFET 200 hereafter). For illustration, the FinFET 200 comprises a fin structure 202 (comprising a first fin 202a of the substrate 20 and a second fin 202b of the substrate 20), an insulation region 204 between the first fin 202a and second fin 202b, a gate electrode layer 214 traversing over the first fin 202a and second fin 202b, and a contact structure 220 on an epitaxial layer 208 adjacent to one side of the gate electrode layer 214. In some embodiments, the FinFET 200 may comprise less than or greater than two fins, for example, one fin or three fins.

Figure 3A:
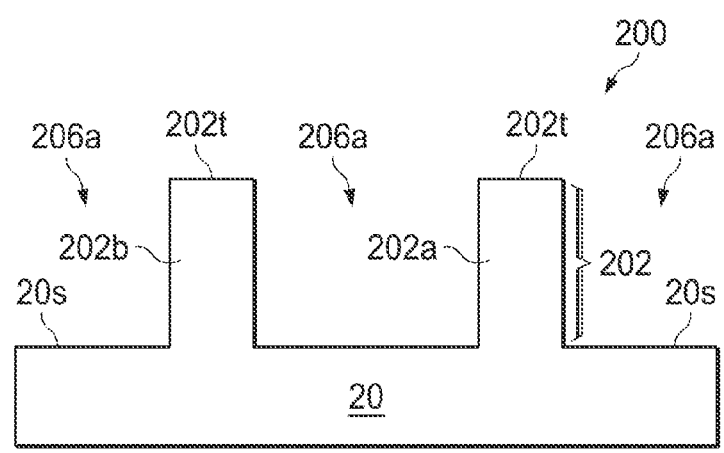
FIGS. 3A-10C are cross-section views of a semiconductor device comprising a contact structure at various stages of fabrication according to various aspects of the present disclosure.
Figure 3B:
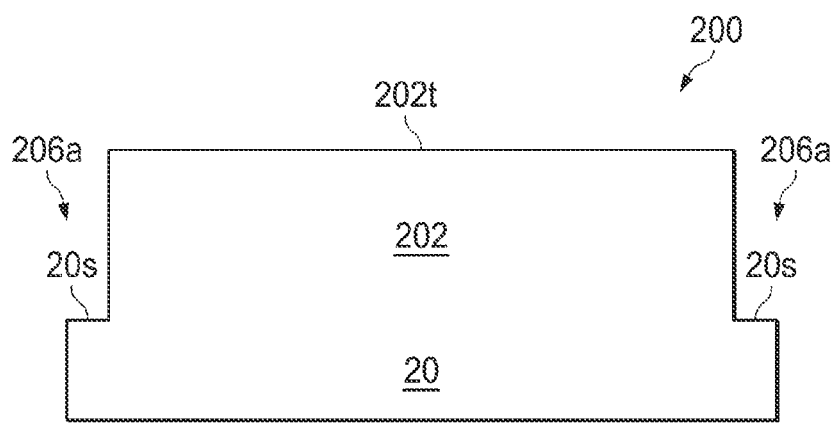
Figure 3C:
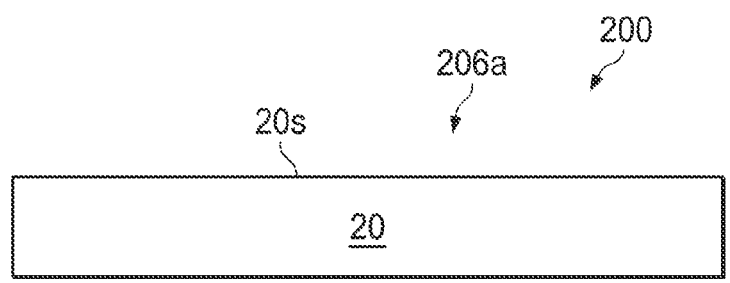

Referring to FIGS. 3A, 3B, and 3C, and step 102 in FIG. 1, a substrate 20 is provided. FIG. 3A is a cross-section view of the FinFET 200 taken along the line a-a of FIG. 2 having a substrate at one of the various stages of fabrication according to an embodiment, FIG. 3B is a cross-sectional view of FinFET 200 taken along the line b-b of FIG. 2, and FIG. 3C is a cross-sectional view of FinFET 200 taken along the line c-c of FIG. 2.

In at least one embodiment, the substrate 20 comprises a crystalline silicon substrate (e.g., wafer). The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 20 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure.

Still referring to FIGS. 3A, 3B, and 3C, the structures in FIGS. 3A, 3B, and 3C are produced by forming a fin structure 202 (comprising a first fin 202a of the substrate 20 and a second fin 202b of the substrate 20) extending above a major surface 20s of the substrate 20 comprising fin top surfaces 202t (step 104 in FIG. 1). In some embodiments, the fin structure 202 may further comprise a capping layer (not shown) disposed on the fins, which may be a silicon-capping layer.

The fin structure 202 is formed using any suitable process comprising various deposition, photolithography, and/or etching processes. An exemplary photolithography process may include forming a photo-sensitive layer overlying the substrate 20 (e.g., on a silicon layer), exposing the photo-sensitive layer to a pattern, performing a post-exposure bake process, and developing the photo-sensitive layer to form a masking element including the photo-sensitive layer. The silicon layer may then be etched using reactive ion etching (RIE) processes and/or other suitable processes to form trenches 206a with a major surface 20s of the substrate 20. Each portion of the substrate 20 between trenches 206a forms one semiconductor fin. In the depicted embodiment, the fin structure 202 (comprising the first fin 202a of the substrate 20 and the second fin 202b of the substrate 20) extends above the major surface 20s of the substrate 20 comprising the fin top surfaces 202t. The photo-sensitive layer is then removed. Next, a cleaning may be performed to remove a native oxide of the semiconductor substrate 20. The cleaning may be performed using diluted hydrofluoric (DHF) acid.

Liner oxide (not shown) is then optionally formed in the trenches 206a. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 206a, which reduces the electrical fields, and hence improves the performance of the resulting integrated circuit.

Figure 4A:
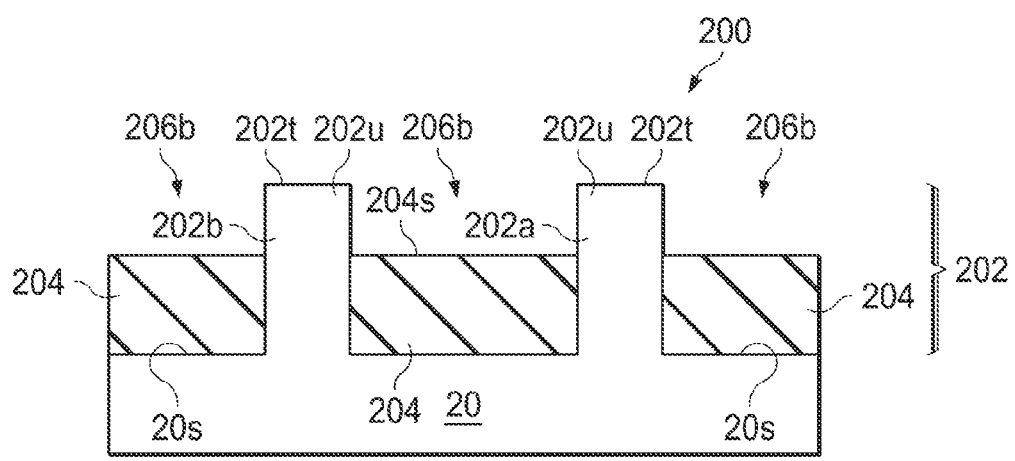
Figure 4B:
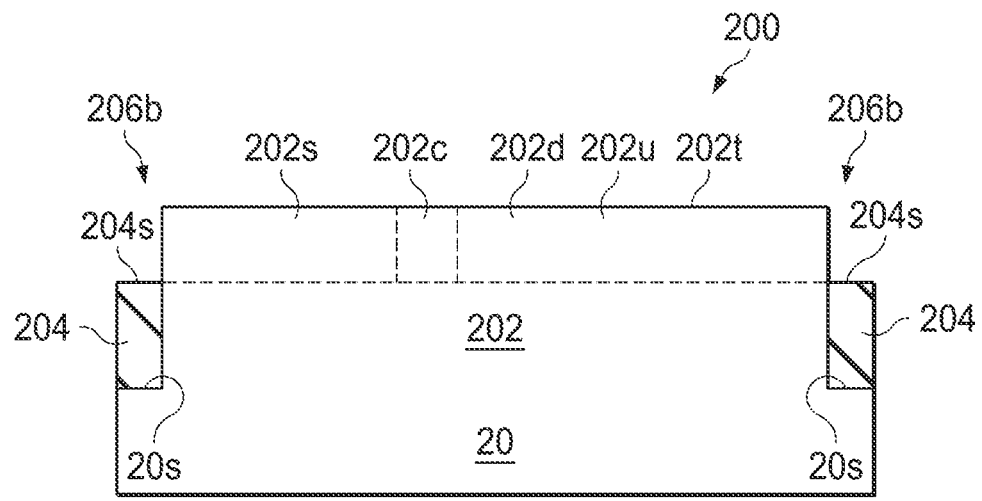
Figure 4C:
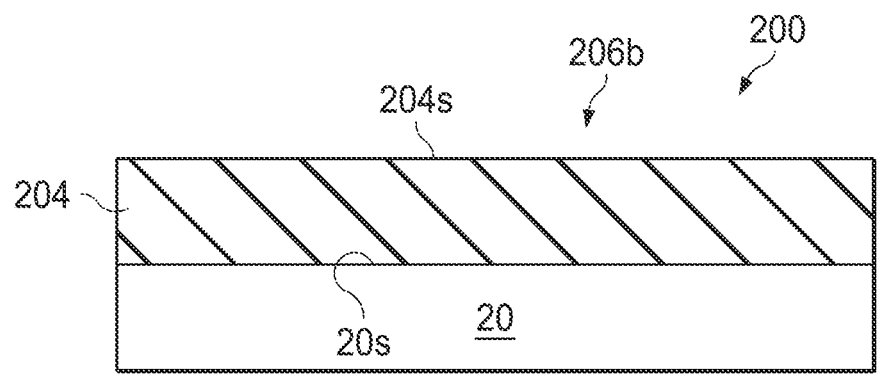

FIG. 4A is a cross-section view of the FinFET 200 taken along the line a-a of FIG. 2 at one of the various stages of fabrication according to an embodiment, FIG. 4B is a cross-sectional view of FinFET 200 taken along the line b-b of FIG. 2, and FIG. 4C is a cross-sectional view of FinFET 200 taken along the line c-c of FIG. 2. The structure in FIGS. 4A, 4B, and 4C are produced by forming an insulation region 204 above the substrate major surface 20s between the first fin 202a and second fin 202b comprising an insulation top surface 204s lower than the fin top surfaces 202t (step 106 in FIG. 1).

In the depicted embodiment, the trenches 22 are filled with a dielectric material to form the isolation regions 204 to define and electrically isolate the various fins of the fin structure 202. In one example, the isolation regions 204 include shallow trench isolation (STI) regions. The isolation regions 204 comprise silicon oxide, silicon nitride, silicon oxynitride, fluoride-doped silicate glass (FSG), a low-K dielectric material, and/or combinations thereof. The isolation regions 204, and in the present embodiment, the STI regions 204, may be formed by any suitable process. As one example, the formation of the STI regions 204 may include filling trenches between the fins (for example, using a chemical vapor deposition process) with a dielectric material. In some embodiments, the filled trench may have a multi-layer structure such as a thermal oxide liner layer filled with silicon nitride or silicon oxide.

A chemical mechanical polish is then performed until the top surface of the fin structure 202 is exposed or reached, followed by recessing the dielectric material by an etching step, resulting in recesses 206b to expose upper portions 202u of the fin structure 202 to form the isolation regions 204. Each of the upper portions 202u of the fin structure 202 comprises two source/drain (S/D) portions 202s, 202d and a channel portion 202c between the two S/D regions 202s, 202d. As such, the insulation region 204 is above the substrate major surface 20s between the first fin 202a and second fin 202b comprising an insulation top surface 204s lower than the fin top surfaces 202t. In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

Figure 5A:
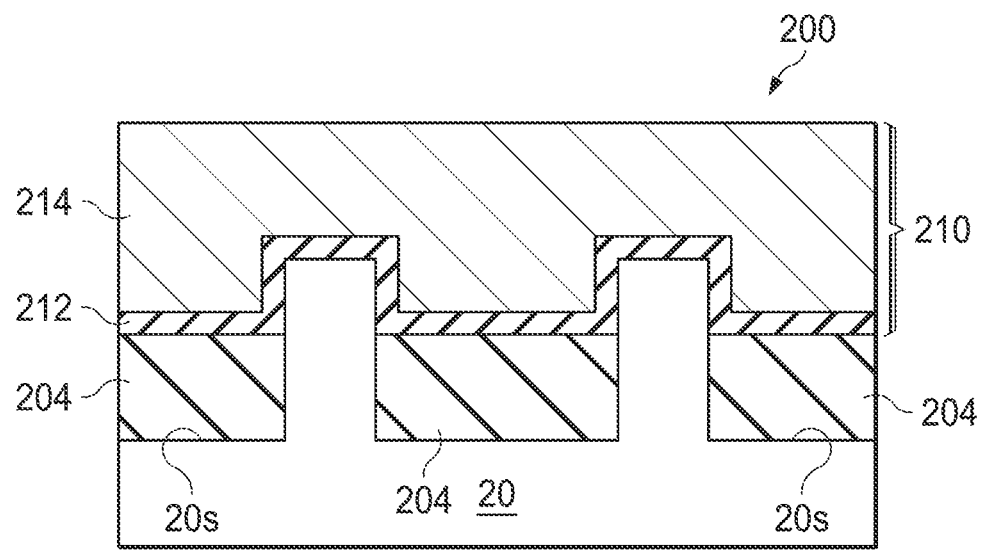
Figure 5B:
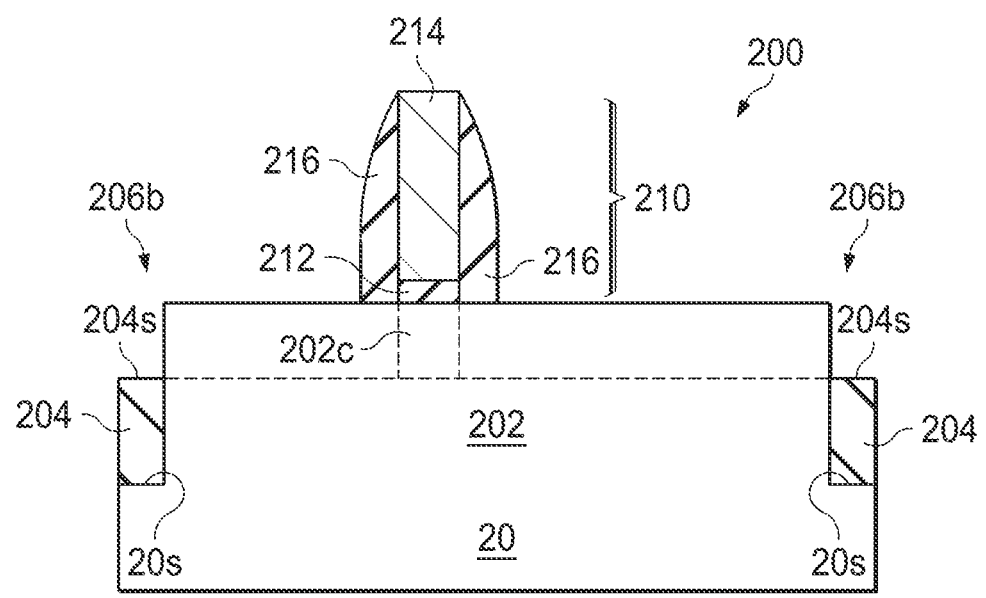
Figure 5C:
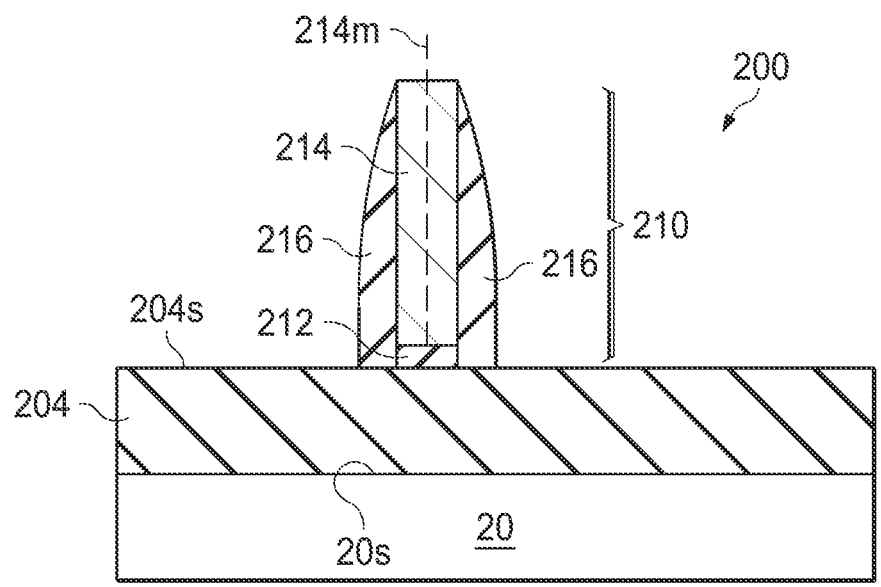

As shown in FIGS. 5A, 5B, and 5C, after formation of the isolation regions 204, the structures in FIGS. 5A, 5B, and 5C are produced by forming a gate electrode layer 214 over channel portions 202c of the first fin 202a and the second fin 202b and extending over a portion of the insulation region 204, wherein a portion of the gate electrode layer 214 over the portion of insulation region 204 comprises a gate middle line 214m (step 108 in FIG. 1). FIG. 5A is a cross-section view of the FinFET 200 taken along the line a-a of FIG. 2 at one of the various stages of fabrication according to an embodiment, FIG. 5B is a cross-sectional view of FinFET 200 taken along the line b-b of FIG. 2, and FIG. 5C is a cross-sectional view of FinFET 200 taken along the line c-c of FIG. 2.

In some embodiments, the gate electrode layer 214 is over a gate dielectric layer 212. The gate electrode layer 214 and the gate dielectric layer 212 form a gate stack 210. In some embodiments, a pair of sidewall spacers 216 is formed on two sides of the gate stack 210. In the depicted embodiment, the gate stack 210 may be formed using any suitable process, including the processes described herein.

In one example, the gate dielectric layer 212 and gate electrode layer 214 are sequentially deposited over the substrate 20. In some embodiments, the gate dielectric layer 212 may include silicon oxide, silicon nitride, silicon oxy-nitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 angstroms to about 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structure 202. The interfacial layer may comprise silicon oxide.

In some embodiments, the gate electrode layer 214 may comprise a single-layer or multilayer structure. In at least one embodiment, the gate electrode layer 214 comprises poly-silicon. Further, the gate electrode layer 214 may be doped poly-silicon with the uniform or non-uniform doping. In an alternative embodiment, the gate electrode layer 214 comprises N-work function metal. The N-work function metal comprises a metal selected from a group of W, Cu, Ti, Ag, Al, TiAl, TiAlN, TaC, TaCN, TaSiN, Mn, and Zr. In an alternative embodiment, the gate electrode layer 214 comprises P-work function metal. The P-work function metal comprises a metal selected from a group of TiN, WN, TaN, and Ru. In the present embodiment, the gate electrode layer 214 comprises a thickness in the range of about 30 nm to about 60 nm. The gate electrode layer 214 may be formed using a suitable process such as ALD, CVD, PVD, plating, or combinations thereof.

Then, a layer of photoresist (not shown) is formed over the gate electrode layer 214 by a suitable process, such as spin-on coating, and patterned to form a patterned photoresist feature by a proper lithography patterning method. In at least one embodiment, a width of the patterned photoresist feature is in the range of about 5 nm to about 45 nm. The patterned photoresist feature can then be transferred using a dry etching process to the underlying layers (i.e., the gate electrode layer 214 and the gate dielectric layer 212) to form the gate stack 210. The photoresist layer may be stripped thereafter.

Still referring to FIGS. 5A, 5B, and 5C, the FinFET 200 further comprises a dielectric layer formed over the gate stack 210 and the substrate 20 and covering sidewalls of the gate stack 210. The dielectric layer may include silicon oxide, silicon nitride, or silicon oxy-nitride. The dielectric layer may comprise a single layer or multilayer structure. The dielectric layer may be formed by CVD, PVD, ALD, or other suitable technique. The dielectric layer comprises a thickness ranging from about 5 nm to about 15 nm. Then, an anisotropic etching is performed on the dielectric layer to form the pair of sidewall spacers 216 on two sides of the gate stack 210.

Figure 6A:
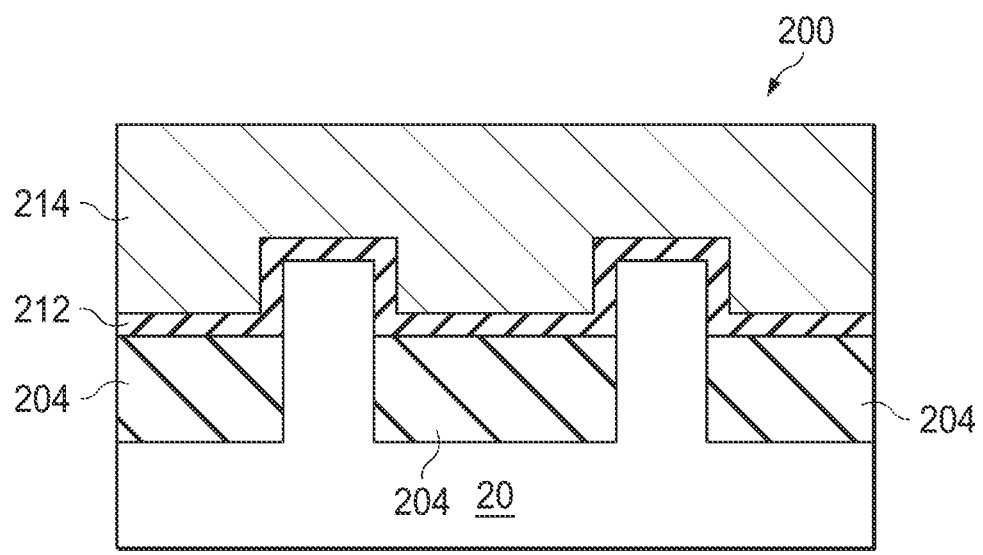
Figure 6B:
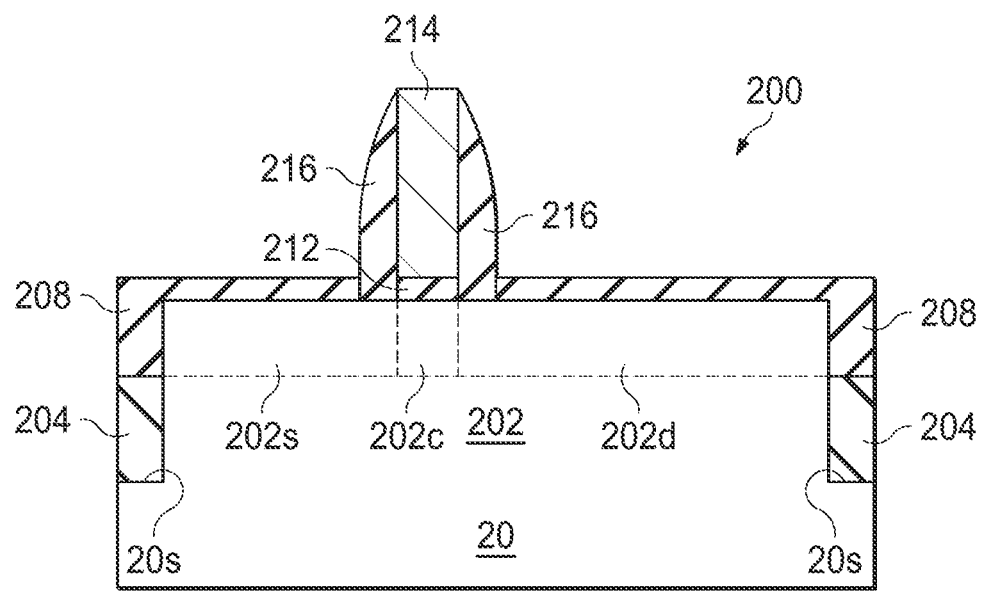
Figure 6C:
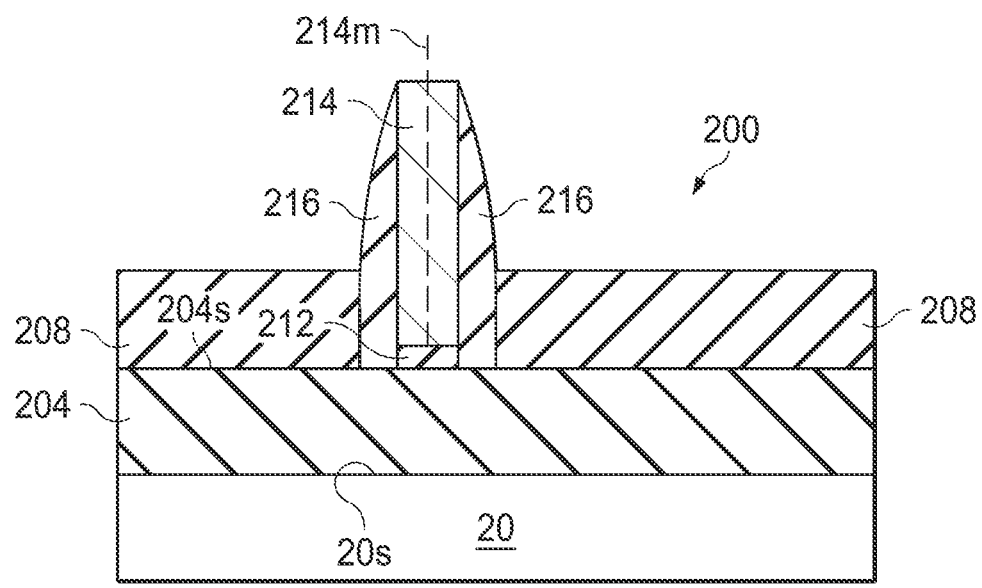

FIG. 6A is a cross-section view of the FinFET 200 taken along the line a-a of FIG. 2 at one of the various stages of fabrication according to an embodiment, FIG. 6B is a cross-sectional view of FinFET 200 taken along the line b-b of FIG. 2, and FIG. 6C is a cross-sectional view of FinFET 200 taken along the line c-c of FIG. 2. As depicted in FIGS. 6A, 6B, and 6C, after forming the gate electrode layer 214, the optional structures in FIGS. 6A, 6B, and 6C are produced by epi-growing a strained material 208 on the S/D portions 202s, 202d of the fins 202 and extending over the insulation region 204, wherein a lattice constant of the strained material 208 is different from a lattice constant of the substrate 20. Thus, the channel portion 202c of the FinFET 200 is strained or stressed to enhance carrier mobility of the device.

In some embodiments, the strained material 208 comprises Si, Ge, SiGe, SiC, SiP, or III-V semiconductor material. In the depicted embodiment, a pre-cleaning process may be performed to clean the S/D portions 202s, 202d with HF or other suitable solution. Then, the strained material 208 such as silicon germanium (SiGe) is selectively grown by a low-pressure CVD (LPCVD) process on the S/D portions 202s, 202d. In the depicted embodiment, the LPCVD process is performed at a temperature of about 400 to about 800° C. and under a pressure of about 1 to about 15 Torr, using $SiH_2Cl_2$, HCl, $GeH_4$, $B_2H_6$, and $H_2$ as reaction gases.

Figure 7A:
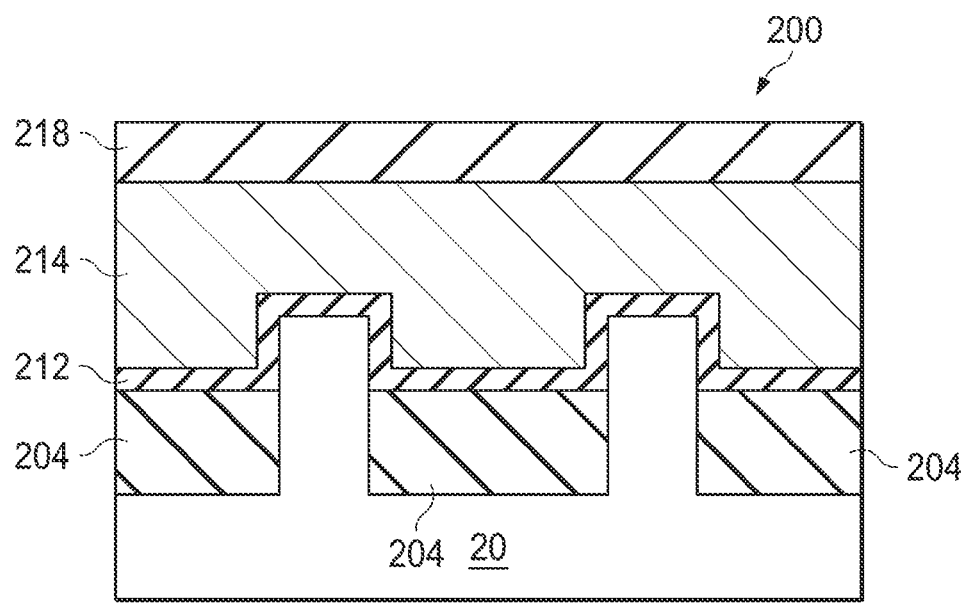
Figure 7B:
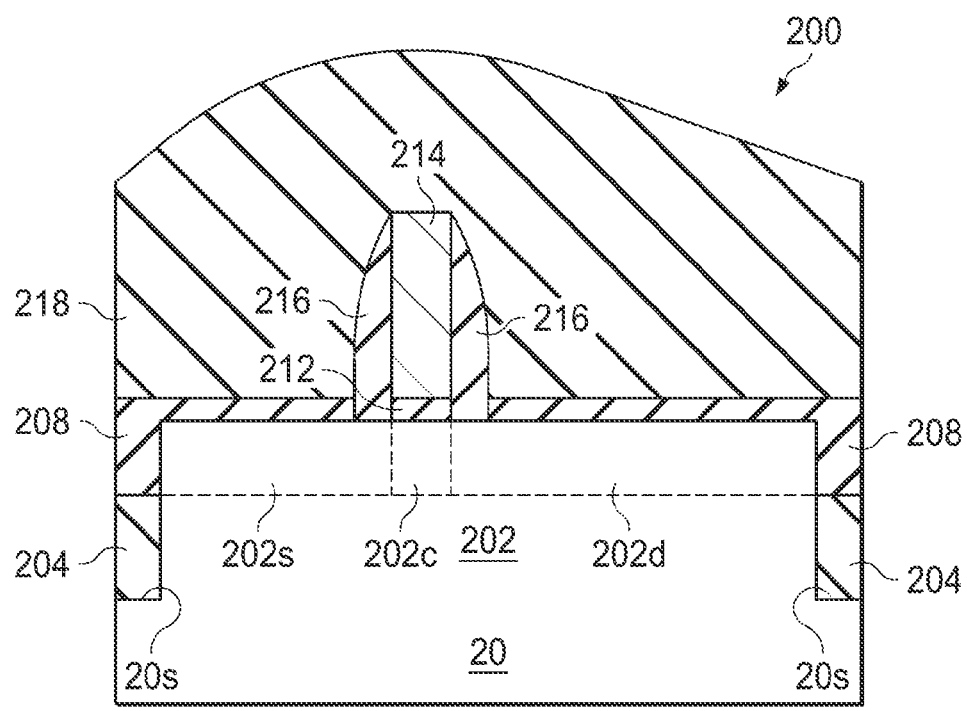
Figure 7C:
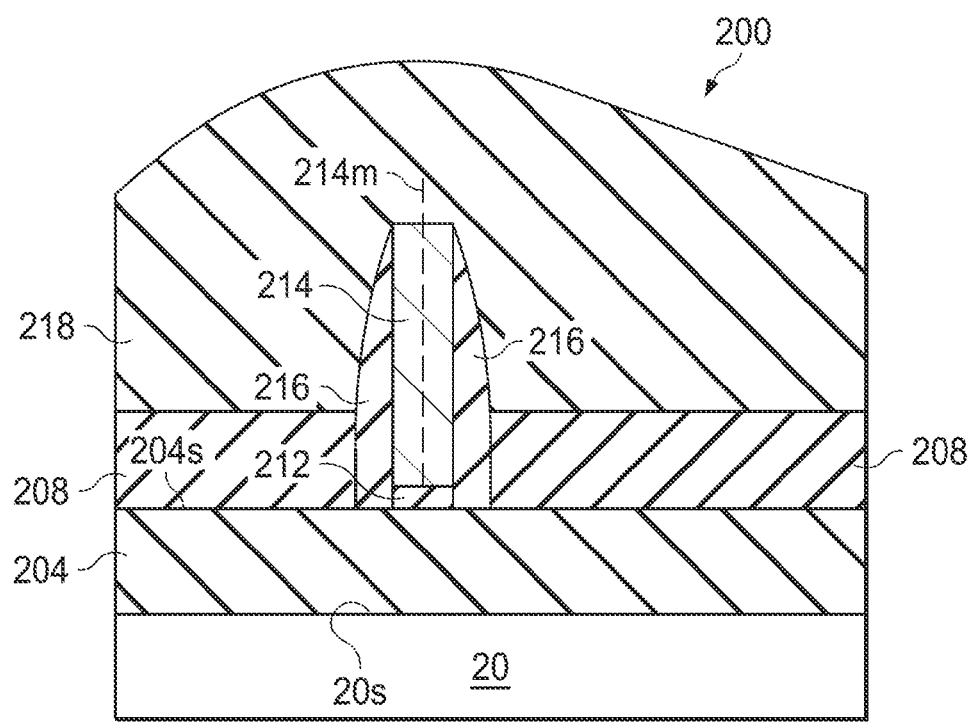

As depicted in FIGS. 7A, 7B, and 7C, and step 110 in FIG. 1, for fabricating a contact structure (such as a contact structure 220 shown in FIG. 10) of the FinFET 200, the structures in FIGS. 7A, 7B, and 7C are produced by forming an inter-layer dielectric (ILD) layer 218 surrounding the gate electrode layer 214 (and the pair of sidewall spacers 216) over the insulation region 204, and extending over the two source/drain (S/D) portions 202s, 202d. FIG. 7A is a cross-section view of the FinFET 200 taken along the line a-a of FIG. 2 at one of the various stages of fabrication according to an embodiment, FIG. 7B is a cross-sectional view of FinFET 200 taken along the line b-b of FIG. 2, and FIG. 7C is a cross-sectional view of FinFET 200 taken along the line c-c of FIG. 2.

The ILD layer 218 comprises a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), and/or combinations thereof. In some embodiments, the ILD layer 218 may be formed over the strained material 208 by CVD, high density plasma (HDP) CVD, sub-atmospheric CVD (SACVD), spin-on, sputtering, or other suitable methods. In the present embodiment, the ILD layer 218 has a thickness in the range of about 4000 Å to about 8000 Å. It is understood that the ILD layer 218 may comprise one or more dielectric materials and/or one or more dielectric layers.

Figure 8A:
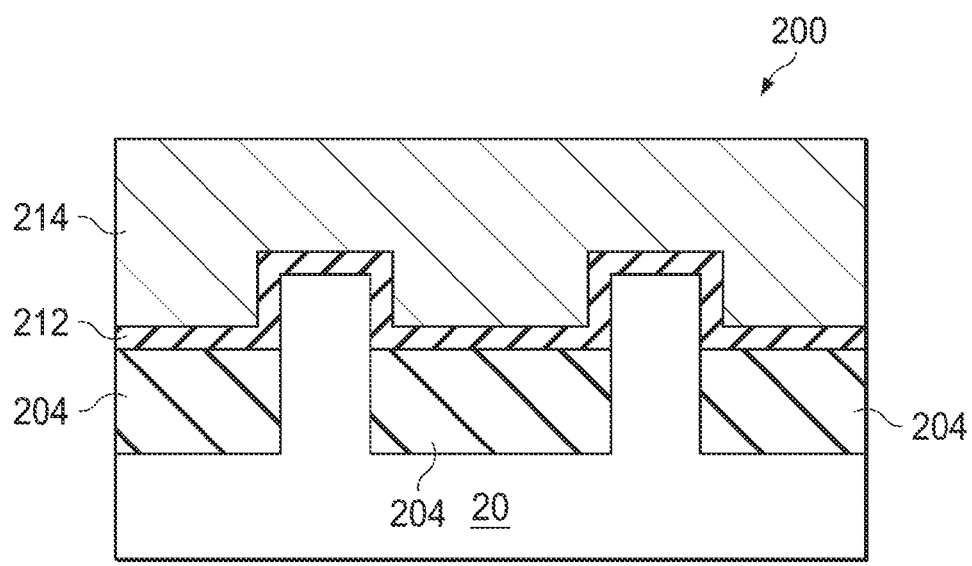

Subsequently, the ILD layer 218 is planarized using a CMP process until a top surface 214s of the gate electrode layer 214 is exposed or reached (shown in FIGS. 8A, 8B, and 8C). The CMP process has a high selectivity to provide a substantially planar surface for the gate electrode layer 214 and ILD layer 218. FIG. 8A is a cross-section view of the FinFET 200 taken along the line a-a of FIG. 2 at one of the various stages of fabrication according to an embodiment, FIG. 8B is a cross-sectional view of FinFET 200 taken along the line b-b of FIG. 2, and FIG. 8C is a cross-sectional view of FinFET 200 taken along the line c-c of FIG. 2.

The process steps up to this point have provided the substrate 20 having the ILD layer 218 over the two S/D portions 202s, 202d. In some applications, two symmetrical S/D contact structures on two sides of the gate electrode layer 214 are formed through the ILD layer 218 to provide electrical contacts to the S/D portions 202s, 202d of the FinFET 200. However, if the gate electrode layer 214 wraps the fin 202 and has a design-rule distance to the two symmetrical S/D contact structures, parasitic capacitance between the S/D contact structures and the gate electrode layer 214 significantly increases and thus degrades the device performance.

Accordingly, the processing discussed below with reference to FIGS. 9A-10C may form two asymmetrical S/D contact structures on two sides of the gate electrode layer 214 to replace the two symmetrical S/D contact structures on two sides of the gate electrode layer 214. Thus, a distance between the gate electrode layer 214 and one of the two asymmetrical S/D contact structures is the design-rule distance if increased parasitic capacitance is acceptable, while a distance between the gate electrode layer 214 and another one of the two asymmetrical S/D contact structures is greater than the design-rule distance, resulting in lower parasitic capacitance if increased parasitic capacitance is unacceptable, thereby enhancing the device performance.

Figure 8B:
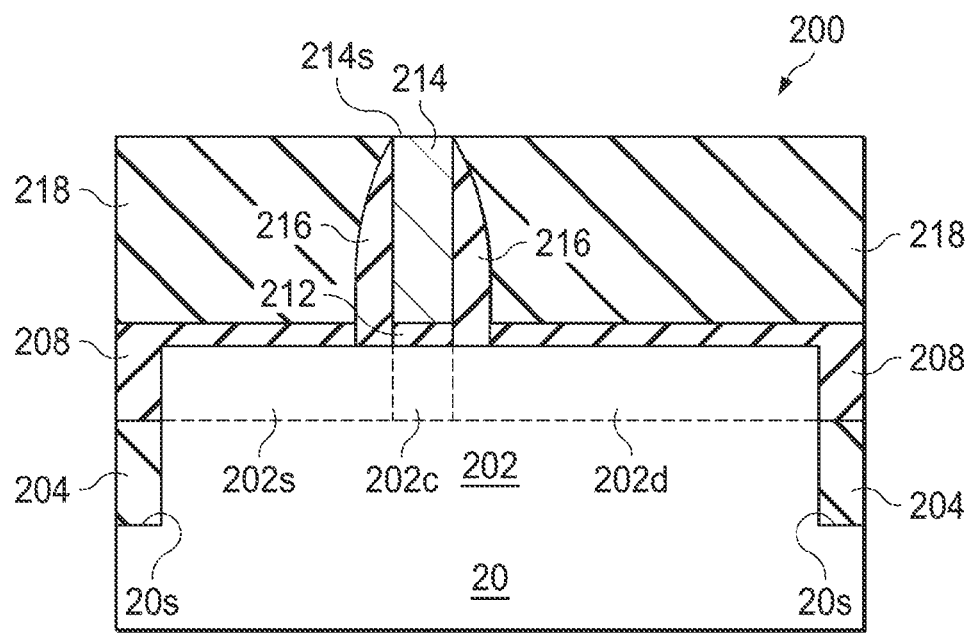
Figure 8C:
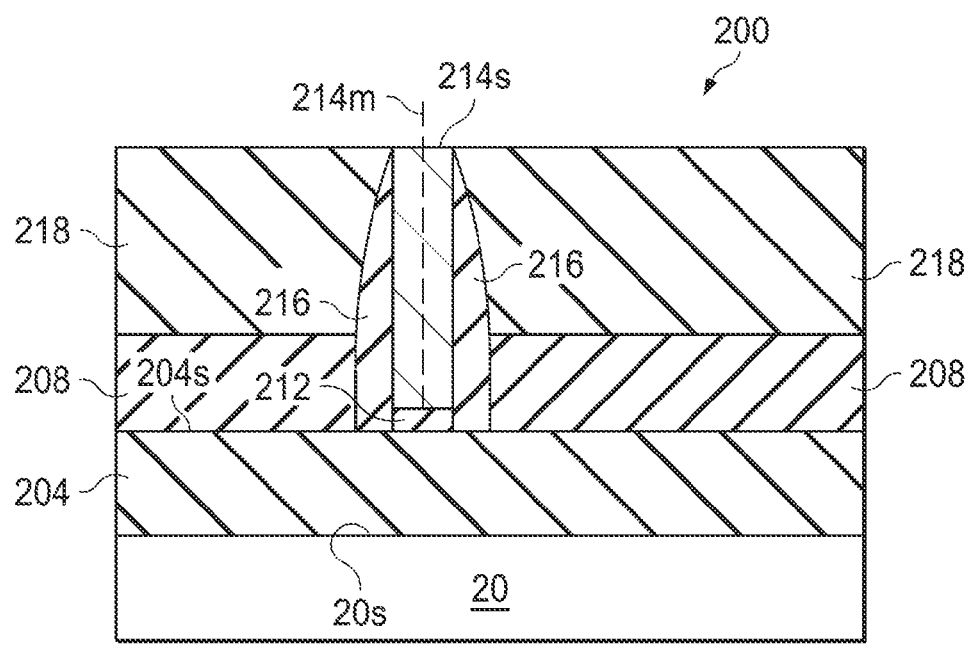
Figure 9A:
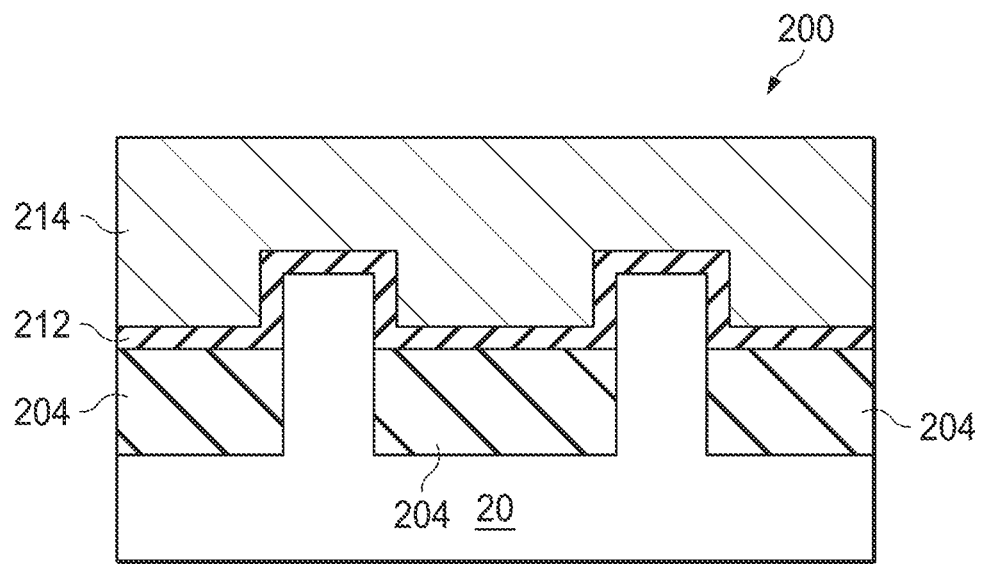
Figure 9B:
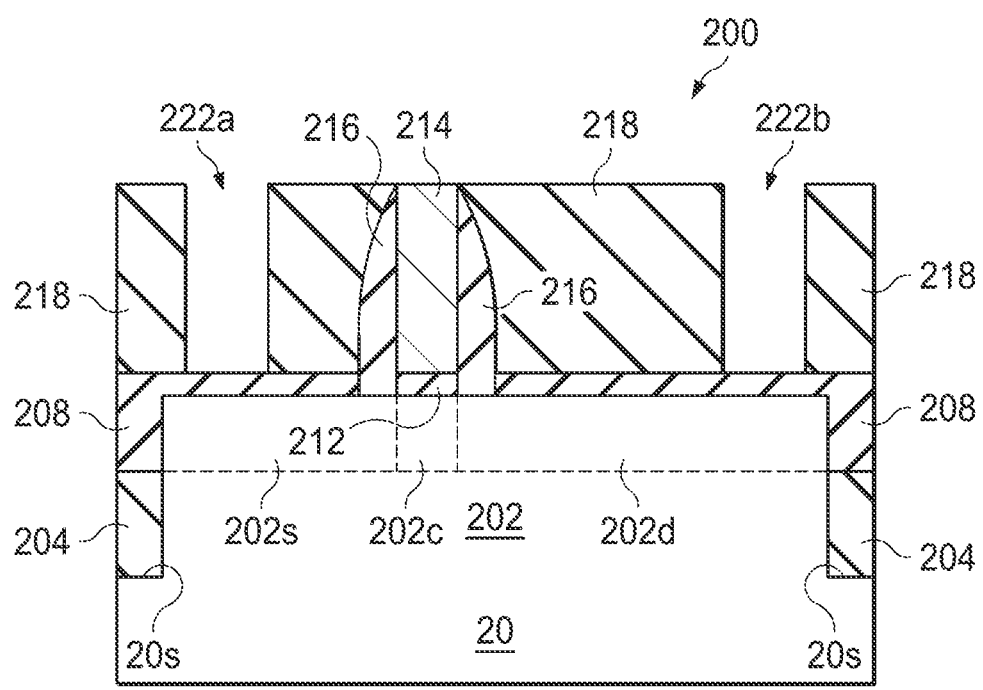
Figure 9C:
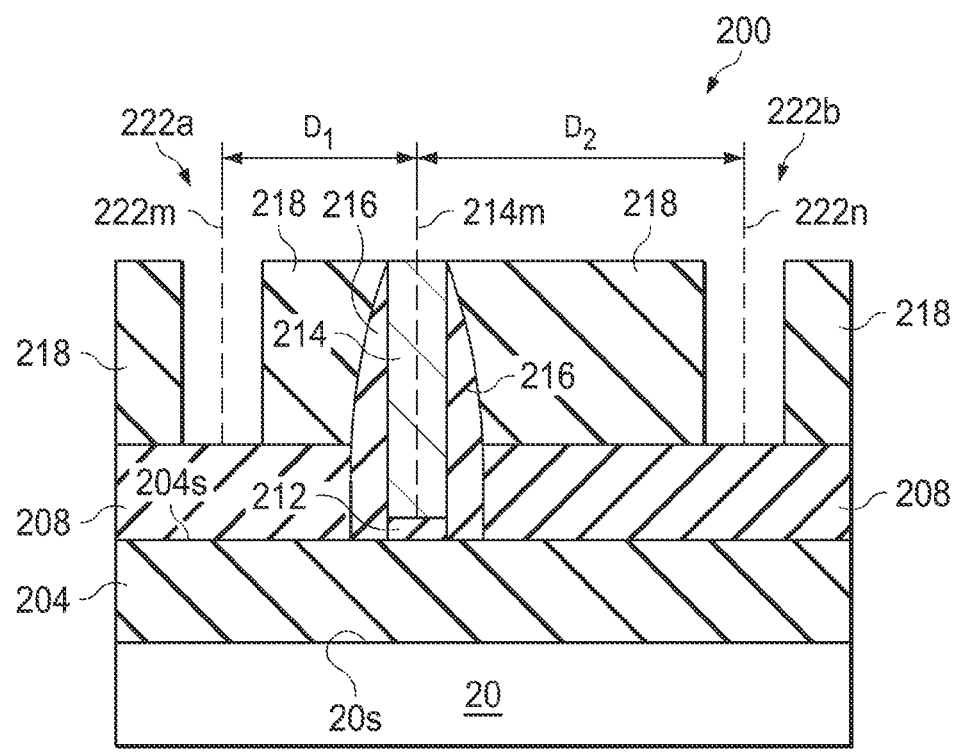

Subsequent CMOS processing steps applied to the FinFET 200 of FIGS. 8A, 8B, and 8C comprise forming contact openings through the ILD layer 218 to provide electrical contacts to the S/D portions 202s, 202d of the FinFET 200. Referring to FIGS. 9A, 9B, and 9C, the structures in FIGS. 9A, 9B, and 9C are produced by forming openings 222 (comprising a first opening 222a and a second opening 222b) in the ILD layer 218 over the insulation region 204, wherein a first distance $D_1$ (i.e., design-rule distance) between a middle line 222m of the first opening 222a and the gate middle line 214m is different from a second distance $D_2$ between a middle line 222n of the second opening 222b and the gate middle line 214m (step 112 in FIG. 1). FIG. 9A is a cross-section view of the FinFET 200 taken along the line a-a of FIG. 2 at one of the various stages of fabrication according to an embodiment, FIG. 9B is a cross-sectional view of FinFET 200 taken along the line b-b of FIG. 2, and FIG. 9C is a cross-sectional view of FinFET 200 taken along the line c-c of FIG. 2.

As one example, the formation of the openings 222 includes forming a layer of photoresist (not shown) over the ILD layer 218 by a suitable process, such as spin-on coating, patterning the layer of photoresist to form a patterned photoresist feature by a proper lithography method, etching the exposed ILD layer 218 (for example, by using a dry etching, wet etching, and/or plasma etching process) to remove portions of the ILD layer 218 to expose a portion of the strained material 208 over the insulation regions 204. The patterned photoresist layer may be stripped thereafter.

Figure 10A:
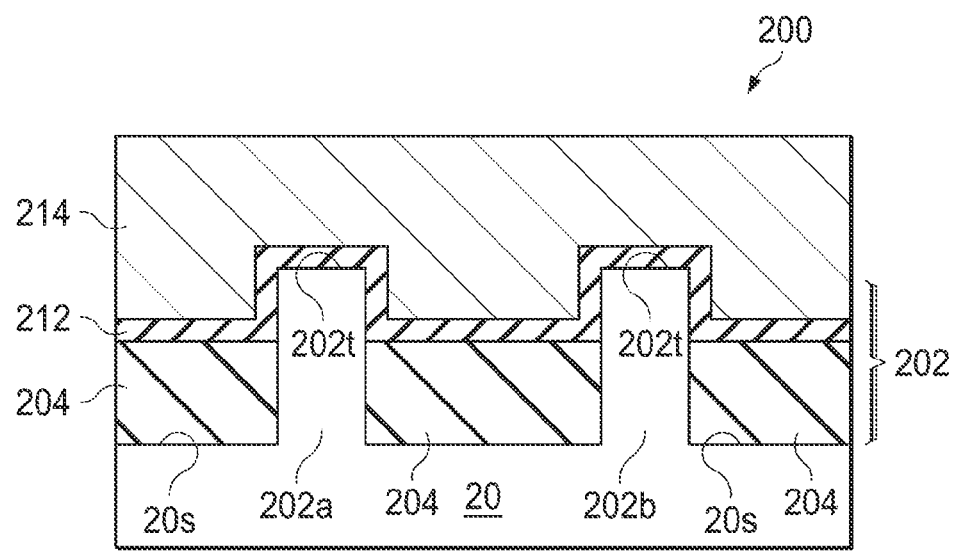
Figure 10B:
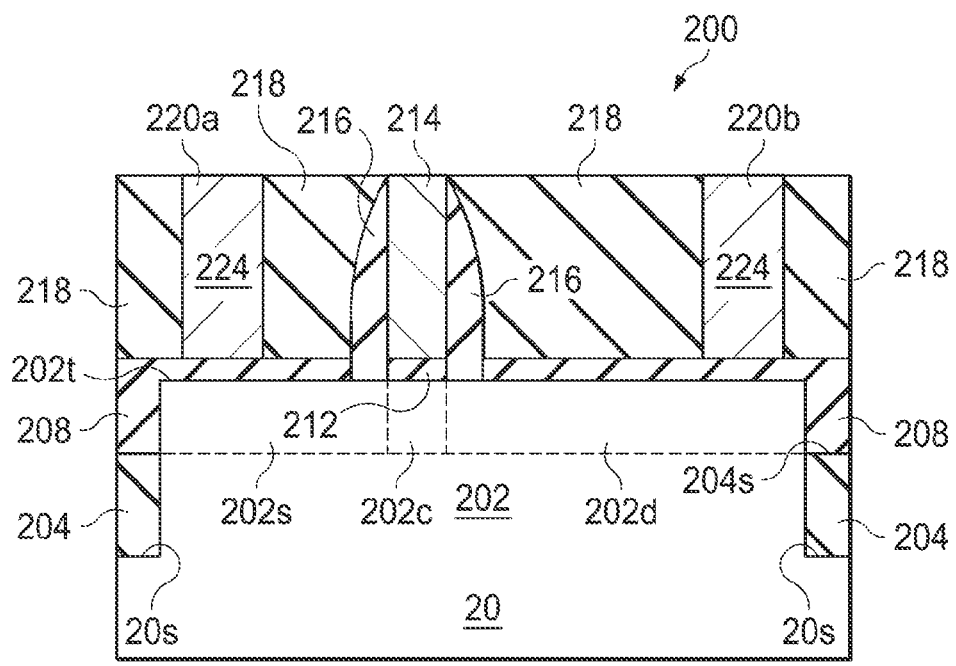
Figure 10C:
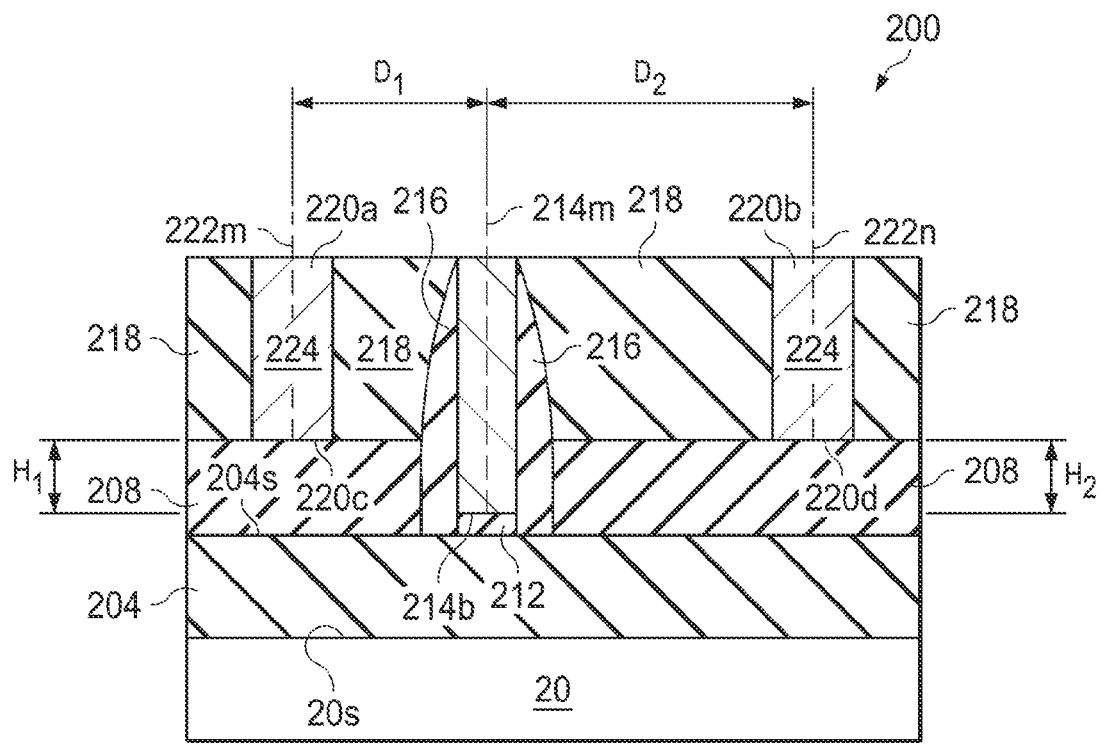

FIG. 10A is a cross-section view of the FinFET 200 taken along the line a-a of FIG. 2 at one of the various stages of fabrication according to an embodiment, FIG. 10B is a cross-sectional view of FinFET 200 taken along the line b-b of FIG. 2, and FIG. 10C is a cross-sectional view of FinFET 200 taken along the line c-c of FIG. 2. Referring to FIGS. 10A, 10B, and 10C, and step 114 in FIG. 1, after formation of the openings 222 in the ILD layer 218, the structures in FIGS. 10A, 10B, and 10C are produced by forming a metal layer 224 in the first opening 222a to form a first contact structure 220a and in the second opening 222b to form a second contact structure 220b. The first contact structure 220a and second contact structure 220b are combined and referred as the contact structure 220.

In some embodiments, the metal layer 224 comprises W, Al, or Cu. In some embodiments, the metal layer 224 may be formed by CVD, PVD, plating, ALD, or other suitable technique. In some embodiment, the metal layer 224 may comprise a laminate. The laminate may further comprise a barrier metal layer, a linear metal layer or a wetting metal layer. Further, the thickness of the metal layer 224 will depend on the depth of the openings 222. The metal layer 224 is thus deposited until the openings 222 are substantially filled or over-filled. Then, another CMP is performed to remove a portion of the metal layer 224 outside of the openings 222, the CMP process may stop when reaching the ILD layer 218, and thus providing a substantially planar surface.

In some embodiments, the semiconductor device 200 comprises the insulation region 204 over the substrate 20; the gate electrode layer 214 over the insulation region 204 comprising the gate middle line 214m; the first contact structure 220a over the insulation region 204 adjacent to the gate electrode layer 214 comprising the first middle line 222m, wherein the first middle line 222m and the gate middle line 214m has the first distance $D_1$; and the second contact structure 220b over the insulation region 204 on a side of the gate electrode layer 214 opposite to the first contact structure 220a comprising the second middle line 222n, wherein the second middle line 222n and the gate middle line 214m has the second distance $D_2$ greater than the first distance $D_1$.

In some embodiments, the FinFET 200 comprises the substrate 20 comprising the major surface 20s; the first fin 202a of the substrate 20 and the second fin 202b of the substrate 20 extending above the substrate major surface 20s comprising fin top surfaces 202t; the insulation region 204 above the substrate major surface 20s between the first fin 202a and second fin 202b comprising the insulation top surface 204s lower than the fin top surfaces 202t; the gate electrode layer 214 over the first fin 202a and the second fin 202b and extending over insulation region 204, wherein the portion of the gate electrode layer 214 over insulation region 204 comprises the gate middle line 214m; the first contact structure 220a over the insulation region 204 adjacent to the gate electrode layer 214 comprising the first middle line 222m, wherein the first middle line 222m and the gate middle line 214m has a first distance $D_1$; and the second contact structure 220b over the insulation region 204 on a side of the gate electrode layer 214 opposite to the first contact structure 220a comprising the second middle line 222n, wherein the second middle line 222n and the gate middle line 214m has a second distance $D_2$ greater than the first distance $D_1$.

In some embodiments, a ratio of the second distance $D_2$ to the first distance $D_1$ is from about 1.1 to about 5. In some embodiments, the gate electrode layer 214 comprises a gate bottom surface 214b and the first contact structure 220a comprises a first bottom surface 220c higher than the gate bottom surface 214b, wherein a first height $H_1$ between the first bottom surface 220c and the gate bottom surface 214b is in the range of about 1 to about 50 nm. In some embodiments, the gate electrode layer 214 comprises a gate bottom surface 214b and the second contact structure 220b comprises a second bottom surface 220d higher than the gate bottom surface 214b, wherein a second height $H_2$ between the second bottom surface 220d and the gate bottom surface 214b is in the range of about 1 to about 50 nm. In some embodiments, a semiconductor layer (i.e. the strained material 208) is between the first contact structure 220a and the insulation region 204.

In the depicted embodiment, the gate stack 210 is fabricated using a gate-first process. In an alternative embodiment, the gate stack 210 may be fabricated using a gate-last process performed by first forming a dummy gate stack. In some embodiments, the gate-last process comprises forming an ILD layer surrounding the dummy gate stack, removing a dummy gate electrode layer to form a trench in the ILD layer, then fill the trench with a conductive gate electrode layer. In some embodiments, the gate-last process comprises forming an ILD layer surrounding the dummy gate stack, removing a dummy gate electrode layer and a dummy gate dielectric layer to form a trench in the ILD layer, then fill the trench with a gate dielectric layer and a conductive gate electrode layer.

After the steps shown in FIG. 1, as further illustrated with respect to the example depicted in FIGS. 3A-10C, have been performed, subsequent processes, comprising interconnect processing, are performed to complete the FinFET 200 fabrication. It has been observed that the second middle line 222n and the gate middle line 214m has the second distance $D_2$ greater than the first distance $D_1$ (i.e., the design-rule distance), resulting in lower parasitic capacitance and enhancing the device performance.

In accordance with embodiments, a semiconductor device comprises an insulation region over a substrate; a gate electrode layer over the insulation region comprising a gate middle line; a first contact structure over the insulation region adjacent to the gate electrode layer comprising a first middle line, wherein the first middle line and the gate middle line has a first distance; and a second contact structure over the insulation region on a side of the gate electrode layer opposite to the first contact structure comprising a second middle line, wherein the second middle line and the gate middle line has a second distance greater than the first distance.

In accordance with another embodiments, a fin field effect transistor (FinFET) comprises a substrate comprising a major surface; a first fin of the substrate and a second fin of the substrate extending above the substrate major surface comprising fin top surfaces; an insulation region above the substrate major surface between the first fin and second fin comprising an insulation top surface lower than the fin top surfaces; a gate electrode layer over the first fin and the second fin and extending over insulation region, wherein a portion of the gate electrode layer over insulation region comprises a gate middle line; a first contact structure over the insulation region adjacent to the gate electrode layer comprising a first middle line, wherein the first middle line and the gate middle line has a first distance; and a second contact structure over the insulation region on a side of the gate electrode layer opposite to the first contact structure comprising a second middle line, wherein the second middle line and the gate middle line has a second distance greater than the first distance.

In accordance with another embodiments, a method of fabricating a semiconductor device comprises providing a substrate; forming a first fin of the substrate and a second fin of the substrate extending above a major surface of the substrate comprising fin top surfaces; forming an insulation region above the substrate major surface between the first fin and second fin comprising an insulation top surface lower than the fin top surfaces; forming a gate electrode layer over channel portions of the first fin and the second fin and extending over a portion of the insulation region, wherein a portion of the gate electrode layer over the portion of insulation region comprises a gate middle line; forming an inter-layer dielectric (ILD) layer surrounding the gate electrode layer over the insulation region; forming a first opening and a second opening in the ILD layer over the insulation region, wherein a distance between a middle line of the first opening and the gate middle line is different from a distance between a middle line of the second opening and the gate middle line; and forming a metal layer in the first opening to form a first contact structure and in the second opening to form a second contact structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
 a fin formed over a substrate, the fin having an elongated axis running in a first direction;
 an insulation region over the substrate, wherein a first portion of the fin is embedded in the insulation region and a second portion of the fin extends above a top surface of the insulation region;
 a gate electrode layer over the insulation region and the fin;
 a first gate spacer on a first side of the gate electrode layer and on the fin;
 a second gate spacer on a second side of the gate electrode layer opposite from the first side of the gate electrode layer, the second gate spacer being on the fin;
 a source region in the fin at the first gate spacer and extending laterally away from the gate electrode layer;
 a drain region in the fin at the second gate spacer and extending laterally away from the gate electrode layer;
 a first contact structure to the source region, the first contact structure comprising a first conductive plug extending through an insulating layer formed over the fin and over the insulation region, wherein the first conductive plug includes a first portion aligned with the elongated axis of the fin and a second portion laterally displaced from the elongated axis of the fin in a direction orthogonal to the elongated axis of the fin and extending over the insulating region, wherein a first distance is between a first middle line of the second portion of the first contact structure and a gate middle line of the gate electrode layer, the source region having a uniform dopant concentration from the first gate spacer to the first contact structure; and
 a second contact structure to the drain region, the second contact structure comprising a second conductive plug extending through the insulating layer formed over the fin and over the insulation region, wherein the second conductive plug includes a third portion aligned with the elongated axis of the fin and a fourth portion laterally displaced from the elongated axis of the fin in a direction orthogonal to the elongated axis of the fin, the fourth portion over the insulation region on a side of the gate electrode layer opposite to the first contact structure, wherein a second distance is between a second middle line of the fourth portion of the second contact structure and the gate middle line of the gate electrode layer, and the second distance is greater than the first distance, the drain region having a uniform dopant concentration from the second gate spacer to the second contact structure.

2. The semiconductor device of claim 1, wherein a ratio of the second distance to the first distance is from about 1.1 to about 5.

3. The semiconductor device of claim 1, wherein the gate electrode layer comprises a gate bottom surface and the first contact structure comprises a first bottom surface higher than the gate bottom surface.

4. The semiconductor device of claim 3, wherein a first height between the first bottom surface and the gate bottom surface is in a range of about 1 nm to about 50 nm.

5. The semiconductor device of claim 1, wherein the gate electrode layer comprises a gate bottom surface and the second contact structure comprises a second bottom surface higher than the gate bottom surface.

6. The semiconductor device of claim 5, wherein a second height between the second bottom surface and the gate bottom surface is in a range of about 1 nm to about 50 nm.

7. The semiconductor device of claim 1, further comprising a semiconductor layer between the first contact structure and the insulation region.

8. The semiconductor device of claim 1, wherein the gate electrode layer comprises P-work function metal or N-work function metal.

9. The semiconductor device of claim 1, wherein the first contact structure comprises W, Al, or Cu.

10. A method of fabricating a semiconductor device comprising:
   forming a first fin of a substrate and a second fin of the substrate extending above a major surface of the substrate comprising respective fin top surfaces;
   forming an insulation region above the major surface of the substrate between the first fin and the second fin comprising an insulation top surface lower than the fin top surfaces;
   forming a gate electrode layer over channel portions of the first fin and the second fin and extending over a portion of the insulation region;
   forming a first gate spacer and a second gate spacer on a first side and a second side of the gate electrode layer, respectively, the first gate spacer extending over the first fin and the second fin, the second gate spacer extending over the first fin, and the second fin, the first side of the gate electrode layer being opposite from the second side of the gate electrode layer;
   forming respective source regions in the first fin and the second fin at the first gate spacer and extending laterally away from the gate electrode layer, and respective drain regions in the first fin and the second fin at the second gate spacer and extending laterally away from the gate electrode layer;
   forming an inter-layer dielectric (ILD) layer surrounding the gate electrode layer over the insulation region;
   forming a first opening and a second opening in the ILD layer over the insulation region, the first opening being over the respective source regions, the second opening being over the respective drain regions, wherein a distance between a middle line of the first opening and a gate middle line of the gate electrode layer is less than a distance between a middle line of the second opening and the gate middle line of the gate electrode layer; and
   forming a metal layer in the first opening to form a first contact structure to the respective source regions and in the second opening to form a second contact structure to the respective drain regions, the respective source regions having a uniform dopant concentration from the first gate spacer to the first contact structure, the respective drain regions having a uniform dopant concentration from the second gate spacer to the second contact structure.

11. The method of claim 10, further comprising:
   epi-growing a strained material on the respective drain regions of the first fin and the second fin and extending over the insulation region after forming the gate electrode layer, wherein a lattice constant of the strained material is different from a lattice constant of the substrate.

12. A method of fabricating a semiconductor device comprising:
   forming a first trench and a second trench in a substrate, a portion of the substrate between the first trench and the second trench forming a fin;
   forming an insulation region in the first trench, a top surface of the insulation region being lower than a top surface of the fin;
   forming a gate electrode layer over a channel portion of the fin, the gate electrode layer extending over the insulation region;
   forming a first gate spacer and a second gate spacer on a first side and a second side of the gate electrode layer, respectively, the first gate spacer extending over the fin, the second gate spacer extending over the fin, the first side of the gate electrode layer being opposite from the second side of the gate electrode layer;
   forming a drain region in the fin at the first gate spacer and extending laterally away from the gate electrode layer, and a source region in the fin at the second gate spacer and extending laterally away from the gate electrode layer;
   forming an inter-layer dielectric (ILD) layer surrounding the gate electrode layer and over the insulation region;
   forming a first opening in the ILD layer over the insulation region and over the drain region in the fin, and a second opening in the ILD layer over the insulation region and over the source region in the fin, wherein a first distance between a middle line of the first opening and a gate middle line of the gate electrode layer is greater than a second distance between a middle line of the second opening and the gate middle line of the gate electrode layer; and
   depositing a metallic material in the first opening to form a first contact structure to the drain region, and in the second opening to form a second contact structure to the source region, the drain region having a uniform dopant concentration from the first gate spacer to the first contact structure, the source region having a uniform dopant concentration from the second gate spacer to the second contact structure.

13. The method of claim 12, wherein a ratio of the first distance to the second distance is from about 1.1 to about 5.

14. The method of claim 12, further comprising epitaxially growing a first strained material over the drain region of the fin and a second strained material over the source region of the fin after forming the gate electrode layer, the first strained material and the second strained material each extending over the insulation region, wherein a lattice constant of the first strained material and a lattice constant of the second strained material is different from a lattice constant of the substrate.

15. The method of claim 14, wherein the first strained material is interposed between the drain region of the fin and the first contact structure.

16. The method of claim 14, wherein the first strained material is interposed between the insulation region and the first contact structure.

17. The method of claim 14, wherein the first gate spacer is interposed between the gate electrode layer and the first strained material.

18. The method of claim 12, wherein the gate electrode layer comprises P-work function metal or N-work function metal.

19. The method of claim 12, further comprising forming a gate dielectric layer over the channel portion of the fin before forming the gate electrode layer.

\* \* \* \* \*